(12) United States Patent
Hougham et al.

(10) Patent No.: US 7,784,669 B2
(45) Date of Patent: Aug. 31, 2010

(54) METHOD AND PROCESS FOR REDUCING UNDERCOOLING IN A LEAD-FREE TIN-RICH SOLDER ALLOY

(75) Inventors: Gareth G. Hougham, Ossining, NY (US); Kamalesh K. Srivastava, Wappingers Falls, NY (US); Sung K. Kang, Chappaqua, NY (US); Da-Yuan Shih, Poughkeepsie, NY (US); Brian R. Sundlof, Verbank, NY (US); S. Jay Chey, Ossining, NY (US); Donald W. Henderson, Ithaca, NY (US); David R. Di Milia, Wappingers Falls, NY (US); Richard P. Ferlita, Wappingers Falls, NY (US); Roy A. Carruthers, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/536,122

(22) Filed: Aug. 5, 2009

(65) Prior Publication Data
US 2010/0155456 A1    Jun. 24, 2010

Related U.S. Application Data

(62) Division of application No. 11/752,382, filed on May 23, 2007, now Pat. No. 7,703,661.

(51) Int. Cl.
*B23K 35/24* (2006.01)
(52) U.S. Cl. .......... 228/178; 228/180.22; 228/56.3; 228/176; 228/180.1; 148/528

(58) Field of Classification Search ............ 228/176, 228/178, 180.22, 56.3, 180.1; 148/528
See application file for complete search history.

(56) References Cited

U.S. PATENT DOCUMENTS

| | | | |
|---|---|---|---|
| 5,346,775 A | 9/1994 | Jin et al. | 428/614 |
| 5,965,197 A | 10/1999 | Jin et al. | 427/180 |

(Continued)

*Primary Examiner*—Kiley Stoner
*Assistant Examiner*—Erin B Saad
(74) *Attorney, Agent, or Firm*—Jon A. Gibbons; Fleit Gibbons Gutman Bongini & Bianco P.L.

(57) ABSTRACT

Briefly, a novel material process is disclosed wherein one or more nucleation modifiers are added, in trace amounts, to a lead-free tin-rich solder alloy to produce a solder composition with reduce or suppressed undercooling temperature characteristics. The modifier being a substance which facilitates the reduction of extreme anisotropic properties associated with body-centered-tetragonal tin based lead-free solder. The addition of the nucleation modifiers to the solder alloy does not materially effect the solder composition's melting point. As such, balls of solder with the nucleated composition freeze while other solder balls within the array remain in the melt. This effectively enables one substrate to be pinned to another substrate by one or more predetermined solder balls to secure the package while the remaining solder joints are in the liquid state. Further, the addition of a trace amount of nucleation sites within the composition facilitates control over the number, size, and orientations of primary intermetallic compounds in tin rich crystallite grains. Moreover, trace amounts of one or more solid and/or insoluble nucleating modifiers within a given volume of solder reduces the size of average crystallites within the composition.

11 Claims, 11 Drawing Sheets

U.S. PATENT DOCUMENTS

| | | | |
|---|---|---|---|
| 5,973,405 A | 10/1999 | Keukelaar et al. | 257/780 |
| 6,205,264 B1 | 3/2001 | Jin et al. | 385/14 |
| 6,283,358 B1 | 9/2001 | Ball | 228/180.21 |
| 6,340,113 B1 | 1/2002 | Avery et al. | |
| 6,805,974 B2 | 10/2004 | Choi et al. | |
| 6,962,835 B2 | 11/2005 | Tong et al. | |

METHOD AND PROCESS FOR REDUCING UNDERCOOLING IN A LEAD-FREE TIN-RICH SOLDER ALLOY

CROSS-REFERENCE TO RELATED APPLICATIONS

This application is a divisional of prior U.S. patent application Ser. No. 11/752,382, filed on May 23, 2007, the entire disclosure of which is herein incorporated by reference in its entirety.

FIELD OF THE INVENTION

The present invention relates generally to a lead-free solder composition and more particularly to solder compositions for reducing undercooling without using lead.

BACKGROUND OF THE INVENTION

Modern electronic devices are typically formed by soldering electronic components together. Such devices can include logic or memory chips on printed circuit boards, multichip modules or complex integrated circuits. In these devices, numerous electrical connections must be formed between a component and its mating substrate (circuit board).

A more recent approach to joining electronic components is "surface mounting" in which metal regions or tabs on the components are aligned and soldered to corresponding metallized pads on the substrate. In these devices, numerous connections must be formed between the component and conductive circuitry on the substrate. The conducting paths may form a tight network or array of connecting points. Thus, accuracy and precision in placement of the conducting pads is essential to proper functioning of the device. In one common approach, often referred to as "ball grid array" BGA assembly, the metallized regions of the component or the mating pad of the substrate are prebumped with solder balls prior to assembly. The assembly is then heated so that reflow of the solder occurs, forming a permanent physical and electrical connection at each soldered point in the array.

However, the reflow of molten solder is not always reliable. The solder can spread further than desired causing short-circuits between adjacent conductive lines. In addition, the solder can migrate from the desired location creating a solder starved joint or one in which the electrical connection has failed entirely. As the density of interconnective lines becomes greater, the problem of solder reliability becomes more difficult to resolve.

Many modern electronic solder connections are thin, high aspect ratio, joints. The solder joint is plastically constrained and can develop triaxial (hydrostatic) stresses several times greater than the average tensile strength of the bulk solder material. In addition, stresses arise from the thermal cycling of electronic circuits as the device incorporating such electronics is turned on and off. The solder joint experiences the full shear resulting from changes in component dimensions with temperature. Thus, even when solder joints are initially satisfactory, the nature of the joint itself becomes a critical point for device failure over time.

There exists a need for better methods and compositions for joining electronic components which can reduce the likelihood of conductive joint failure during the initial soldering process, and/or inhibit subsequent joint fatigue and/or fracture. Methods and compositions that can improve the efficiency of assembling ball grid arrays (BGAs) and the like would provide a solution to a problem in the art of automated manufacturing of complex electronic devices. Likewise, soldering methods and compositions which reduce triaxial stresses and, hence, the potential for joint fatigue, solder fracture or other electronic failure of thin, high aspect, solder joints are needed in the arts.

The microelectronic industry relies on solder alloys with precisely controlled and reproducible properties. These properties include the temperatures of phase transitions, both melting upon heating and freezing upon cooling, which are important for the processes of package fabrication. The final, solid properties, such as electrical conductivity, mechanical strength and ductility, grain structure and orientation are important to the operation and the longevity of solder joints.

Assembly of complex microelectronic packages require many different solder types. Two properties of growing concern are the undercooling and the crystal grain orientation. Undercooling (UC) or the degree of undercooling can be defined as the temperature difference between the solder's melting and freezing points. At the melting point, the solder composition would be almost entirely in a liquid state. At the freezing point, the solder composition would be almost entirely in a solid state. In between, there is a supercooling condition.

Most materials have small undercooling temperatures (UCT). But some solders, (notably tin containing solders such as SnCu compositions) have significant undercooling temperatures. Sometimes, these undercooling temperatures are on the order of 100 degrees C. This phenomenon arises because the crystallization of the solder composition requires, at the atom level, assembly from randomized atoms in the liquid state into highly ordered crystalline lattices. Sometimes the liquid form is in a pseudo-ordered state which must be overcome through a higher energy intermediate transition state in order to establish a different ordering on the atomic level to form the crystalline structure. Such is the case with tin which is an icosohedron phase structure in the melt (liquid state) and must first transition to a crystalline tetragonal structure of beta tin. This exacerbates the degree of undercooling for this solder composition.

In addition, the increased use of low alpha emitting solders, which are of higher purity, also exacerbates undercooling behaviors. In less pure solders, unintended impurities sometimes nucleate crystallization. Crystallization proceeds very rapidly once nucleation has taken place. Nucleation is favored when there are solid surfaces which can template the transition to the crystalline form. This is a type of solid phase heterotaxy where the final crystal structure maps off the exposed face crystal structure of the template. Other times the way in which the solid phase template acts is less certain as there is no known structural, dimensional, or other similarities which can be observed.

However fortuitous, this impurity-mediated nucleating effect cannot be relied upon. Therefore, substitutes must be found which give a measure of control during manufacture to the undercooling characteristics of the solder while not deleteriously affecting other properties of the solder joint itself, which the microelectronics industry has come to rely upon.

SUMMARY OF THE INVENTION

A method is disclosed for inducing nucleation sites in a lead-free tin rich solder alloy. The method produces a solder composition with reduced undercooling temperature and relatively uniform crystallite distributions with random orientations without significantly altering the composition's melting point. Advantageously, solder joints comprising the composition freeze to a solid joint while other joints in the same BGA array remain in the melt.

Nucleation modifiers are selected to produce a predetermined undercooling temperature in the solder composition. The modifiers being sufficiently physically small to avoid point inhomogeneities in the final joint. The selected modifiers are then added to solder alloy in sufficiently small quantities (ppm) such that the concentration thereof comprises only a small fraction of a percent by weight of overall composition. The mixture is such that the nucleating modifiers provide non-excessive heterogeneous nucleation sites within the composition to avoid adversely impacting the strength of the joint upon freezing.

Nucleating modifier generally comprise at least one of Pt, Ir, Rhodium, Ruthenium, Rhenium, Osmium, and tin and their alloys and compounds or Be, Fe, Cu, Ni, and their alloys and compounds, or at least one of Mo, Zr, Hf, W and their alloys and compounds. The nucleating modifiers can be a non-metal such as an oxide, mineral particle, or organic molecule. The modifier can be insoluble within a given volume of solder composition. The modifier alternatively can be a substance which facilitates the reduction of extreme anisotropic properties associated with body-centered-tetragonal tin based lead-free solder. Alternatively, the modifier solidifies in the form of one or more intermetallics at temperatures higher than the melting temperature of the solder composition. Alternatively, it could be an organic compound that has a melting point greater than the solder melting point and an appropriate crystal structure to nucleate. Still another alternative, it can be an organic compound that thermally decomposes at the solder melting point and the resulting carbonized product can nucleate.

In another aspect of the invention, different solder compositions are made with varying nucleating modifiers which have identical melting points but different undercooling temperatures. Improvements to processes in the microelectronics manufacturing industry can be achieved by the strategic utilization of two or more nucleating modifiers within a single C4 bump array or ball grid array (BGA). Since ball joints with minimal undercooling characteristics will freeze with only slight cooling, the chip and module can be pinned together while other remaining joints within the array remain in the liquid state. With the chip or module held firmly in place, freezing subsequently takes place on other C4 BGA balls at much lower temperature thus reducing stress in subsequent packaging formations. This is particularly advantageous at high DNP (distance from neutral point) locations within the module. This also effectively enables the establishment of the placement of the chip early in the cooling process thereby increasing reflow oven throughput. DNP is defined as from Microelectronics Packaging Handbook edited by Rao R. Tummala and Eugene J. Rymaszewski as "The separation of a joint from the neutral point on a chip. This dimension controls the strain on the joint imposed by expansion mismatch between the chip and substrate. The neutral point is usually the geometric center of the array of pads and defines the point at which there is no relative motion of chip and substrate in the X-Y plane during thermal cycling."

Another aspect of this invention is the use of thin coatings of nucleating modifiers on contact surfaces in order to change the behaviors of the contacting solder compositions. Examples of such surfaces include BGA pads, C4 pads, and C4NP molds. The nucleation modifiers are effectively added to the solder composition through a layer of terminal metallurgy.

A solder composition with a reduced undercooling temperature is advantageous in the art of microelectronic packaging because one particular C4 ball in the array can be made to freeze while other C4 balls in the same array remain in the melt. A single bump or cluster of two or three nucleation modified C4 balls can be positioned in the center to freeze at a reduced undercooling temperature to pin the module in place, leaving the outer bumps to freeze with the greatest undercooling possible. In addition, a plurality of C4 balls with reduced undercooling temperature in an array of C4 balls has many advantages. For instance, differential pinning of distant multiple points across the array helps control 3D warpage. This deliberately imparts a stress gradient between the pinned distant balls and, in doing so, can impart one or more controlled curvatures if it is desired to manipulate the shape and overall stress of the package during manufacture. This also helps reduce final effect of CTE mismatch without expensive process time to cool an entire array held in place by precise tooling.

Further, having a cluster of C4 balls freeze, for example, in the middle of an array allows for a chip to be secured to a substrate in a central area where strain due to thermal expansion mismatch is relatively minimal while joining can still occur along the periphery of the chip in a more controlled manner at a later stage. This minimizes stress while retaining the advantage of early pinning or can alternatively pin in two or more distant places using modified solder leaving areas in between to solidify at lower temperatures with unmodified solder. This creates regions of high stress in order to effectively manipulate the shape of the package elements themselves. Thus upon cooling, predefined areas will be pinned first and, upon further cooling, a stress axis will develop along that line causing bowing and controlled distortion that can be used to counteract unwanted bowing and distortion along that or other axis. As such, bow distortion could be induced in a controlled fashion to counteract undesirable bow imparted by bonded devices, inherent warp, etc. One skilled in this art would find many uses for the solder compositions of and process steps of this invention.

The invention will next be described in connection with certain illustrated embodiments. However, it should be understood that various changes and modifications can be made by those skilled in the art without departing from the spirit or scope of the invention.

BRIEF DESCRIPTION OF THE DRAWINGS

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

While the specification concludes with claims defining the features of the invention that are regarded as novel, it is believed that the invention will be better understood from a consideration of the following description in conjunction with the drawing figures, in which like reference numerals are carried forward.

It should be understood that one skilled in this art would have a firm understanding of metallurgy particularly as it relates to solder, solder compositions, undercooling, nucleation, to name a few. One skilled in this art would also have an understanding of various microelectronic manufacturing terms and processes, such as C4, C4NP, BGA, Wafer Bumping, to name a few.

A novel material process is disclosed herein wherein trace amounts of one or more nucleation modifiers, defined supra, to a tin rich lead-free solder alloy produces a solder composition which advantageously brings about reductions to the degree of undercooling of the composition without significantly altering the composition's melting point. A solder composition with reduced undercooling freezes at a higher temperature and thus before other solder with the same melting point. This effectively enables one substrate to be pinned to another substrate by one or more solder balls to secure the package while the remaining joints are still in a liquid state. Further, the addition of a trace amount of nucleation sites within the composition facilitates control over the number, size, and orientations of primary intermetallic compounds in tin rich crystallite grains. Moreover, trace amounts of one or more solid and/or insoluble nucleating modifiers within a given volume of solder reduces the size of average crystallites within the composition.

The nucleation modifiers are added in sufficiently small quantities (ppm) in order to provide non-excessive heterogeneous nucleation sites within the composition. Excess nucleation sites within the composition adversely impacts the strength of the joint upon freezing. Ideally such concentrations are not only minor as an overall constituent, (as in a small percent weight) but are also physically small in order to avoid point inhomogeneities in the final solid solder joint. Further, trace quantities of nucleation modifiers produces a solder composition which advantageously brings about significant reductions to the degree of undercooling of the solder.

Nucleation sites promote the freezing of the tin grain in random orientations. Randomization of the tin grain produces joint-average properties, such as: diffusion, mechanical compliance, and thermal expansion. This effectively enables such joints to have an increased level of reliability.

Furthermore, the addition of nucleation sites within the composition facilitates control over the number, size, and orientations of primary intermetallic compounds particularly in tin rich crystallite grains. Further, control of the number of nucleation sites within a solder composition by purposefully adding trace amounts of one or more solid and/or insoluble nucleating modifiers within a given volume reduces the size of average crystallites within the composition.

The nucleation modifiers are substances which provide nucleation sites within a solder composition. Nucleation modifiers include elemental particles such as Pt, Ir, Rhodium, Ruthenium, Rhenium, and tin and their alloys and compounds Be, Fe, Cu, Ni, and their alloys and compounds, and Mo, Zr, Hf, and W and their alloys and compounds. In another embodiment Sn itself has been found to work advantageously. Other metals have been found to be less effective. Other materials will be effective nucleating modifiers as small particles of higher melting alloys. Additionally, some non-metals such as oxides, mineral particles, and organic molecules will be effective depending on their crystal structures and surface characteristics. Such additional nucleating modifiers are envisioned herein and therefore are intended to fall within the scope of this invention. Other nucleating modifiers are envisioned herein. Osmium, for example, is expected to be an effective nucleating modifier but toxicity concerns cannot be ignored.

Ideally such nucleating substances are not only minor as an overall constituent, (as in a very small percent weight) but also are physically small in order to avoid point inhomogeneities in the final solid solder joint. Nucleating substances facilitate the formation of large numbers of small grains within the composition. The nucleating modifiers of the invention reduce the suppression of freezing point characteristics by providing sites for heterogeneous nucleation which, in turn, facilitate the reduction of extreme anisotropic properties associated with body-centered-tetragonal tin based lead-free solder. The nucleation modifier should preferably remain in a solid state when added to the liquid phase and preferably does not react with the liquid phase of the solder composition. If it does, the reaction product should be in the solid state. The nucleation modifiers would remain suspended in the liquid phase by utilization of colloidal phenomenon. A nucleation modifier could also solidify in the form of one or more intermetallics at temperatures higher than the melting temperature of the solder. A nucleation modifier is preferably a metallic element with a melting point higher than the liquid phase of the solder composition but alternatively can be a metallic element coated, for example, with an oxide such as Al2O3, or a nitride, such as BN, with a melting point higher than the liquid phase. A nucleation modifier could alternatively be an oxide or a nitride particle which has a melting point higher than the liquid phase of the solder composition. It could also be the reverse, an insulator coated with an outside layer of metal.

Different solder compositions can be made with varying nucleating modifiers which have identical melting points but different undercooling temperatures. Improvements to processes in the microelectronics manufacturing industry can be achieved by the strategic utilization of two or more nucleating modifiers within a single C4 bump array or ball grid array (BGA). Since ball joints with minimal undercooling characteristics will freeze with only slight cooling, the chip and module can be pinned together while other remaining joints within the array remain in the liquid state. With the chip or module held firmly in place, stress in subsequent packaging formations can be minimized. This is particularly advantageous at high DNP (distance from neutral point) locations within the module. This also effectively enables the establishment of the placement of the chip early in the cooling process thereby increasing reflow oven throughput.

Further, the addition of nucleating modifiers which may be soluble in the superheated liquid phase but, upon cooling, precipitate as an intermetallic compound such as, for example, PtSn4, thereby facilitating the transition from the liquid to the supercooled to the crystalline state. The addition of trace nucleating constituents of essentially insoluble solids to some solder alloys also improves control of phase change behaviors which benefits both the processing and final properties of the joint itself.

Advantageously, the use of different solder compositions on the same BGA or C4 array minimizes stress while enabling early pinning or fixation of the modules in the manufacturing process. More specialized use of solder compositions at specific joints comprising one or more nucleating modifiers would be for shape control of organic modules, chips and PCBs. This would involve placement of minimal undercooling C4 ball joints to pin the two substrates at discrete points so that, when further cooled, stress is induced in specific locations within the array. This is often referred to as controlled flexing. This is particularly useful in manufacturing when it is important to counteract stresses imparted from one or more devices attached on an opposite side of a particular module. Advantageously, combinations of differently nucleated solders of the same nominal composition can be utilized to control differential freezing on different parts of a substrate to impart or counteract curvature.

Figure 1:
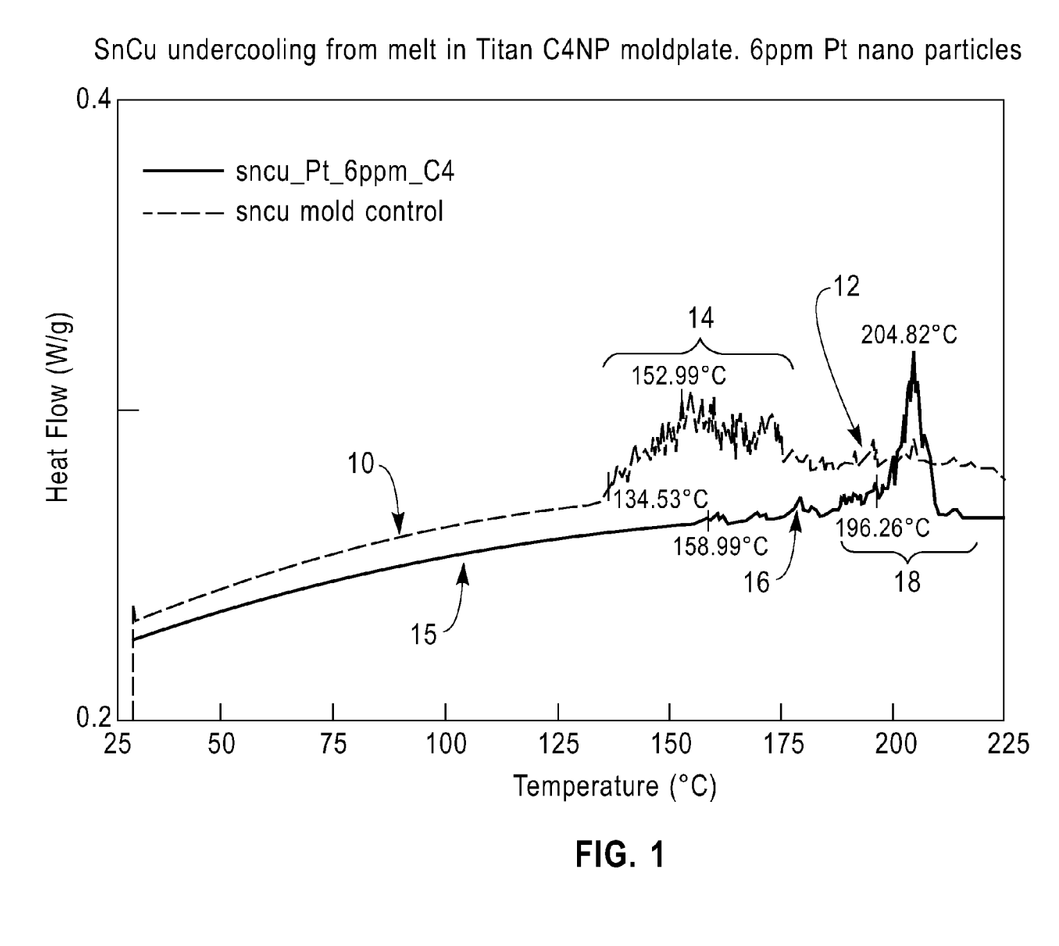
FIG. 1 is a Differential Scanning Calorimetry (DSC) Overlay of two arrays of SnCu C4 balls during cooling and freezing wherein curve 10 is standard SnCu solder and curve 15 is of the solder composition which has been doped with the nucleation modifier platinum nano-particles to a concentration of 6 ppm.

Reference is now being made to FIG. 1 which is a Differential Scanning Calorimetry (DSC) overlay produced in a manner commonly found in the arts. The left-hand axis on the DCS graph represents a range (0.2 to 0.4) of heat flow in (Watts/gram). The bottom axis of the DCS graph represents temperature in degrees Celsius. The graph shows two arrays of C4 balls during cooling and freezing from the melt. The top curve 10 is of standard solder SnCu(0.7) used as a control. The bottom curve 15 is a solder composition comprised of a nucleation modifier added in a concentration of 6 ppm of platinum (Pt) nano-particles to induce nucleation in the composition. Other concentrations up to 999 ppm can be used advantageously with the current invention. This effectively reduces or suppresses the composition's undercooling temperature. The percent weight of the Cu in the SnCu solder alloy is approximately 0.7% (referred to herein as SnCu (0.7)). The top curve 10 and the bottom curve 15 were run twice to confirm that the effect was reproducible.

As the molten C4 balls cool from the melt, they do not freeze at their melting point of 228 degrees C., but remain in the liquid state until approximately 195 degrees C. wherein the first C4 ball freezes. This is shown by exothermic peak 12 of curve 10. This is the highest freezing C4 ball and has an undercooling temperature of approximately 228−195=33 degrees C. Most of the C4 balls in this array will freeze at temperatures centering around 153 degrees C., shown as a range of temperatures collectively at 14. The last C4 ball of standard solder (curve 10) does not freeze until 134.53 degrees C. (or approximately 135 degrees C.). This constitutes an undercooling temperature of approximately 228−135=93 degrees C.

By contrast, nucleated composition of curve 15 shows that the first C4 ball freezes approximately 212 degrees C. (the upper end of 18). The undercooling of this solder composition is 228−212=16 degrees C. Most of the C4 balls in this array freeze in the cluster centering at around 205 degrees C. (collectively at 18). The last C4 ball in this array to freeze is at 158.99 degrees C. at 16.

Figure 2:
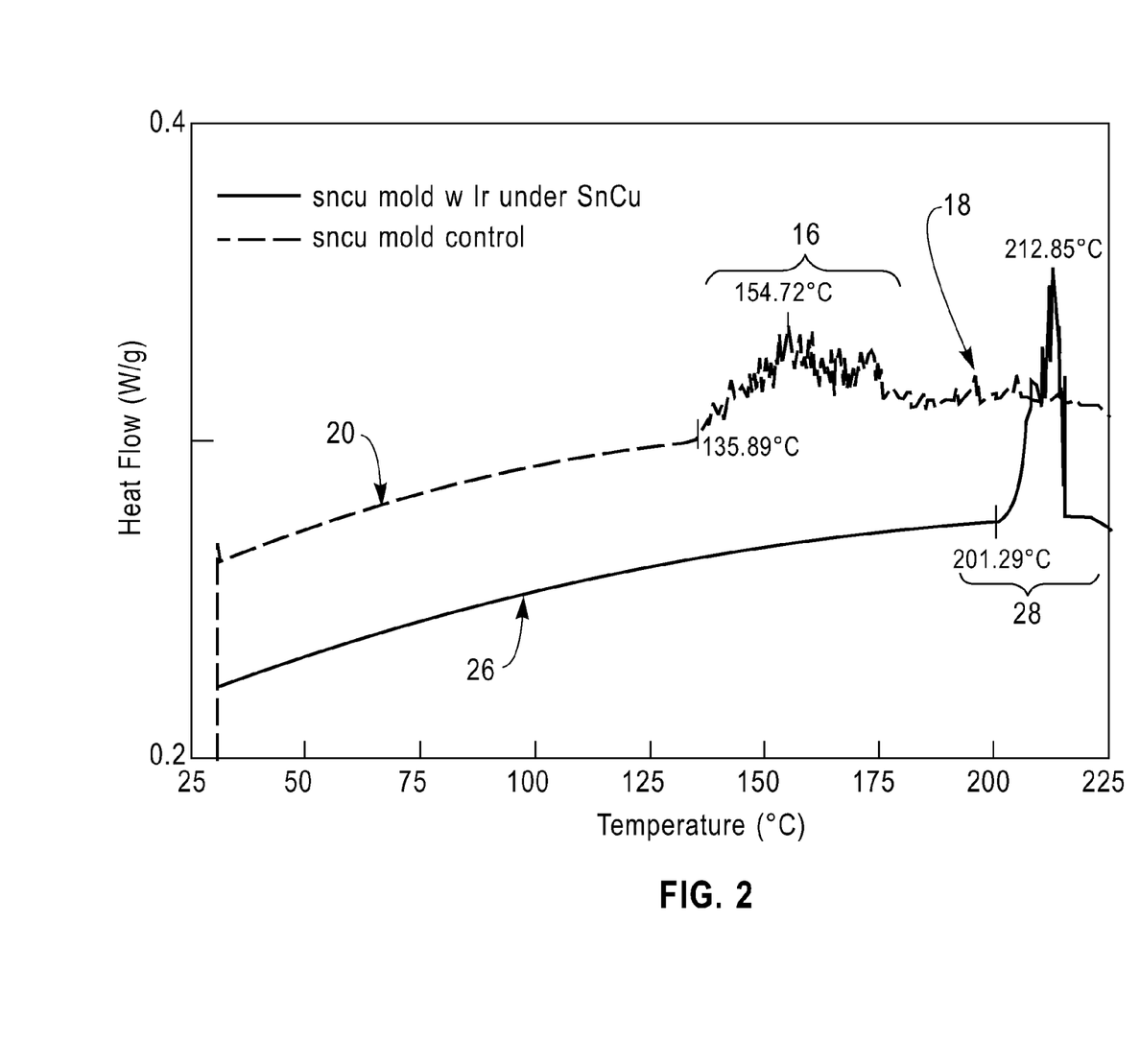
FIG. 2 is a Differential Scaning Calorimetry (DSC) Overlay of two arrays of SnCu C4 balls during cooling and freezing wherein curve 20 is of standard SnCu solder and curve 26 is of the same solder cooled while in contact with a 100 angstrom thick layer of Iridium metallurgy representing terminal metallurgy on a C4 or BGA pad.

Reference is now being made to FIG. 2 which is a Differential Scanning Calorimetry (DSC) overlay produced in the same manner as the DCS graph of FIG. 1, showing two arrays of SnCu(0.7) C4 balls during cooling and freezing from the melt. The top curve 20 is of standard solder and the bottom curve 26 is solder cooled while in contact with a 100 angstrom thick layer of iridium (Ir), specifically a glass C4NP mold. One skilled in this art would understand that the contact herein is also representative of terminal metallurgy on a C4 or BGA pad.

The top curve 20 shows cooling of C4 balls in a manner as previously described with reference to FIG. 1. The bottom curve represents the freezing behavior of an array of C4 balls in a glass C4NP mold coated with a 100 angstrom think layer of iridium prior to the mold being filled with solder. The melting point for this solder is approximately 228 degrees C. It can be seen that, as the sample cools from above the melting point, it passes through 228 degrees C. with none of the C4 balls freezing until approximately 215 degrees C. (the upper end of the temperature range shown at 18) when the C4 balls begin to freeze. The first C4 balls to freeze have an undercooling temperature of approximately 228−215=13 degrees C. The remainder of the C4 balls freezes in a cluster centered on approximately 212 degrees C. (shown in the temperature range 16). The last C4 balls freeze at 201.29 degrees C. (approximately 201 degrees C.) shown as 28. This produces an undercooling of 228 degrees–201 degrees=27 degrees. C.

Another aspect of this invention involves the use of thin coatings of nucleating modifiers on contact surfaces in order to change the behaviors of the contacting solder compositions. Examples of such surfaces include BGA pads, C4 pads, and C4NP molds. The nucleation modifiers are effectively added to the solder composition through a layer of terminal metallurgy.

C4NP is a process known in the art of microelectronic manufacture for applying C4 solder bumps to the bottom of wafers, With it, solder is formed into C4 bumps by injection of molten solder into a mold of the size and C4 pattern of a wafer. The injection of the solder into the mold cavities is carried out by moving the mold under a reservoir of molten solder. Elastic seals contain the solder to a small region the mold plate. The nucleation modified solder compositions described herein have utility in C4NP. As the filled regions move outside the seal defined area, it is desirable to have one or more portions of the solder already frozen (in a solid state) so that it lies essentially flat in the mold cavity. If is still liquid it tends to ball or clump-up. This interferes with automatic inspection processes which may subsequently or concurrently occur. Thus, the inability to control undercooling of the solder is a problem because the solder in the cavities cannot cool sufficiently to freeze (nearly 100 degrees C. below melting point) in the short distance dictated by the C4NP solder injection head. Thus, any method to reduce the undercooling makes this C4NP mold fill process easier and less costly.

In addition, or alternatively to using nucleation modified solders with C4NP, one could also choose to deposit a small amount of the desired modifiers into the bottom of the C4NP mold cavities. This could be done by pre-depositing small dots of nucleation modifiers prior to the addition of the liquid solder into the mold. By using masking processes on the mold during manufacture, a dot of one or more nucleation modifiers having a thickness of, for example, 500 angstroms may outlast the mold. Alternatively, the mold cavities could be refreshed after each cycle during washing by using a final rinse with a dilute suspension of nucleating modifiers.

The nucleating modifiers can be formed in a number of ways.

For example, ball milling of solder pellets with additions of the desired nucleation modifiers will embed into the solder metal. Alternatively, pellet blasting of a target consisting of the desired nucleating metals with pellets of solder will abrade small quantities of the nucleation modifier upon each impact and embed into the solder upon multiple collisions.

Mechanical agitation of molten solder at high sheer rates would mix and disaggregate the nucleation particles. Simple mixing of particles with molten solder may be sufficient in cases where agglomeration is not an issue.

Evaporation of thin layers of nucleation modifiers onto solder pellets followed by melt would result in higher surface areas not ordinarily available in small particles. Films only 50 angstrom thick can be deposited onto the solder pellets.

Electro or electro-less plating of thin layers of trace elements onto solder pellets followed by melt with mixing is yet another method of depositing a controlled thin layer.

E-Beam heating is another method to melt the nucleation particles or thin film that had been deposited onto the solder pellets. This advantageously rapidly heats the solder surface to relatively high temperatures. In so doing, high melting point metals, such as Ir and Pt, may melt and mix with the liquid solder. This would be advantageous if there is at least a small level of solubility. In the laboratory, this method successfully incorporated Pt and Ir nano-particles into a SnCu solder composition.

Nucleating modifiers can be added to the solder in bulk. These can be of either heterogeneous or homogenous mixtures. There may be circumstances where nucleation modifiers could be advantageously added to bulk solder and also to the terminal pad metallurgy. There may be different nucleating modifiers in order to exercise greater control over the two main target improvements—change in the freezing point, and the distribution of small grain crystallites. In this case, resulting solder balls within a C4 or BGA array would have very similar concentrations and therefore would have the same melting point, reduced undercooling temperature, and have relatively uniform crystallite distributions.

Figure 3:
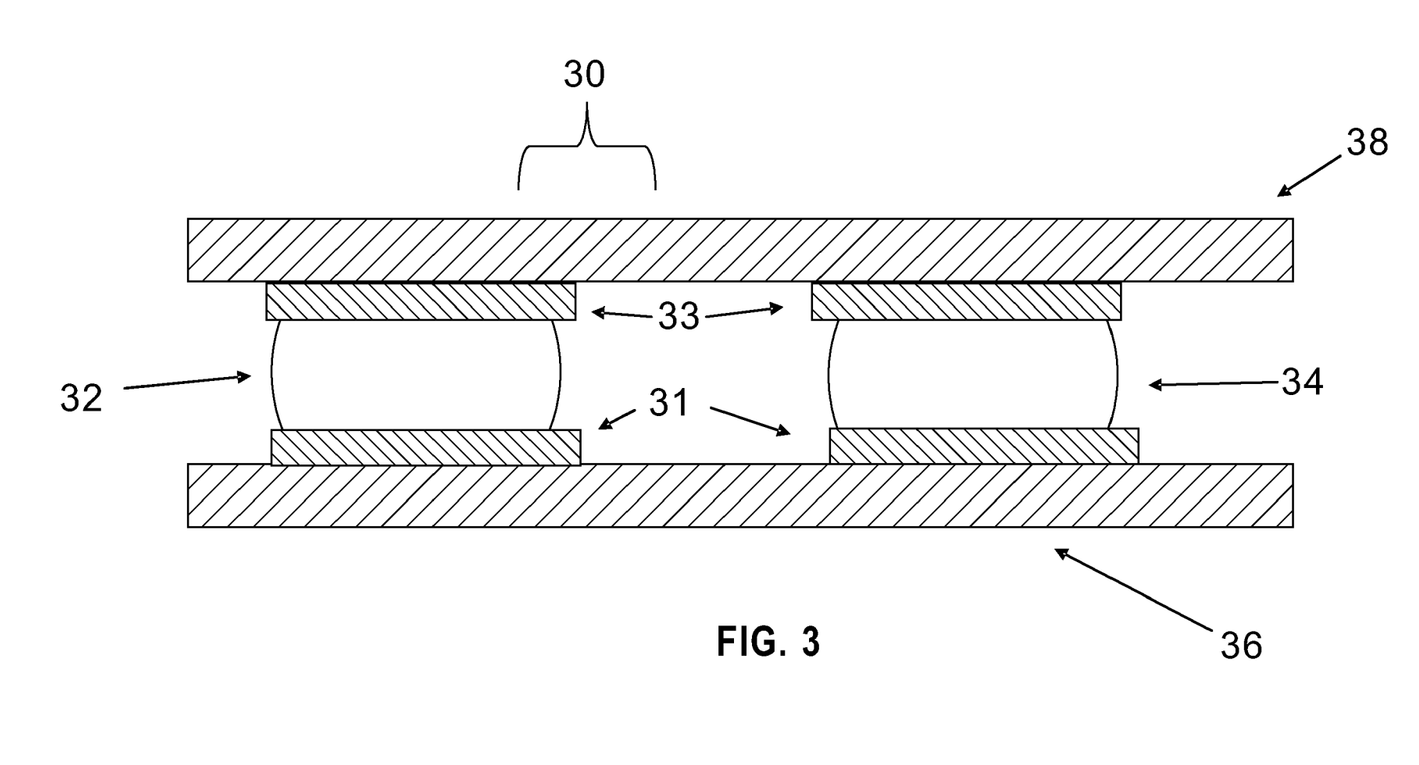
FIG. 3 is a side view of two C4 ball joints 32 and 34 joining two substrates above and below representing a C4 solder joint bonding two circuit elements together such as, for example, a silicon chip 36 joined to module 38, or printed circuit board 36 joined to module 38.

Reference is now being made to FIG. 3, which illustrates a cross section of a package 30 with two C4 ball joints 32 and 34 joined to an above substrate 36 and a below substrate 38 by solder attachment to conductive pads 31 and 33. One skilled in this art would understand that this configuration would most commonly be illustrative of a C4 ball joint bonding a silicon chip to some kind of chip carrying module, each by attachment to metal pads with a metallurgy stack. It is also representative of the bonding of a module to a printed circuit board.

Figure 4A:
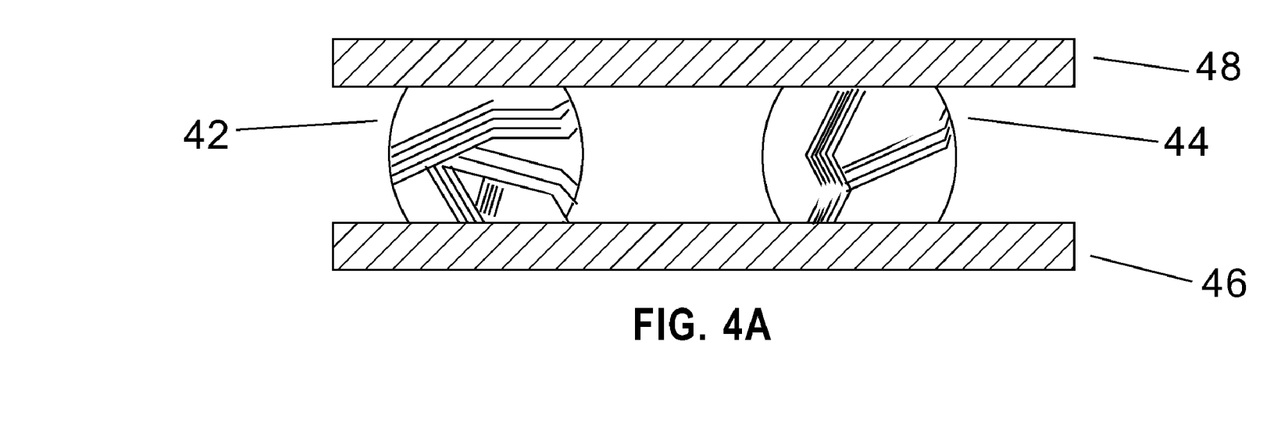
FIG. 4A illustrates a SnCu solder joint found in the arts containing large grain structures relative to the size of the ball in order to show that differences in the size, number, placement, and/or distribution of such crystallite grain structures may vary significantly across any two C4 ball joints thereby imparting significantly different mechanical properties to each joint.

Reference is now being made to FIG. 4A which illustrates two C4 balls 42 and 44 securing substrate 48 from above to substrate 46 below. The SnCu solder joint contains large grain structures (show by lines within the ball not to scale) relative to the size of the ball. This illustrates that differences in the size, number, placement, and/or distribution of such crystallite grain structures may vary significantly across any two C4 ball joints. In some instances, the crystalline grains may extend from the left side of the ball to the right side of the ball. In addition, daughter crystallites may protrude therefrom in any direction. Such differences in grain structures impart widely varying mechanical properties to each C4 ball joint.

Figure 4B:
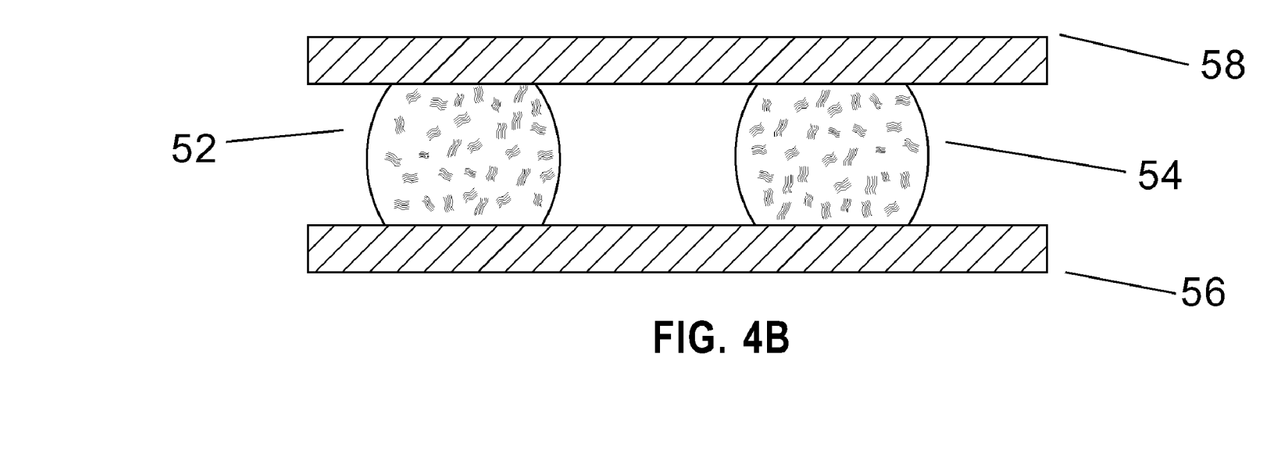
FIG. 4B illustrates a SnCu solder joint composition doped with nucleation modifiers of this invention to catalyze nucleation within the joint itself in order to impart a larger volume density of grains across the structure with the average grain size being small with a relatively randomized spatial orientation in order to impart to the C4 ball joints not dissimilar mechanical properties.

Reference is now being made to FIG. 4B which illustrates a SnCu solder joint comprising two C4 balls 52 and 54 joining substrate 58 from above to substrate 56 from below. The SnCu composition contains nucleation modifiers to catalyze nucleation. This imparts a larger volume density of grains across the C4 ball with the average grain size being relatively small with a relatively randomized spatial orientation and uniformly distributed. This is shown in the C4 balls as smaller grain structures (not to scale) relative to the grain structures of FIG. 4A. Smaller grain structures impart to the C4 ball joints similar mechanical properties.

Reference is now being made to FIGS. 5-11 to further illustrate the utility of having a particular C4 ball with the same array freeze before others.

Figure 5:
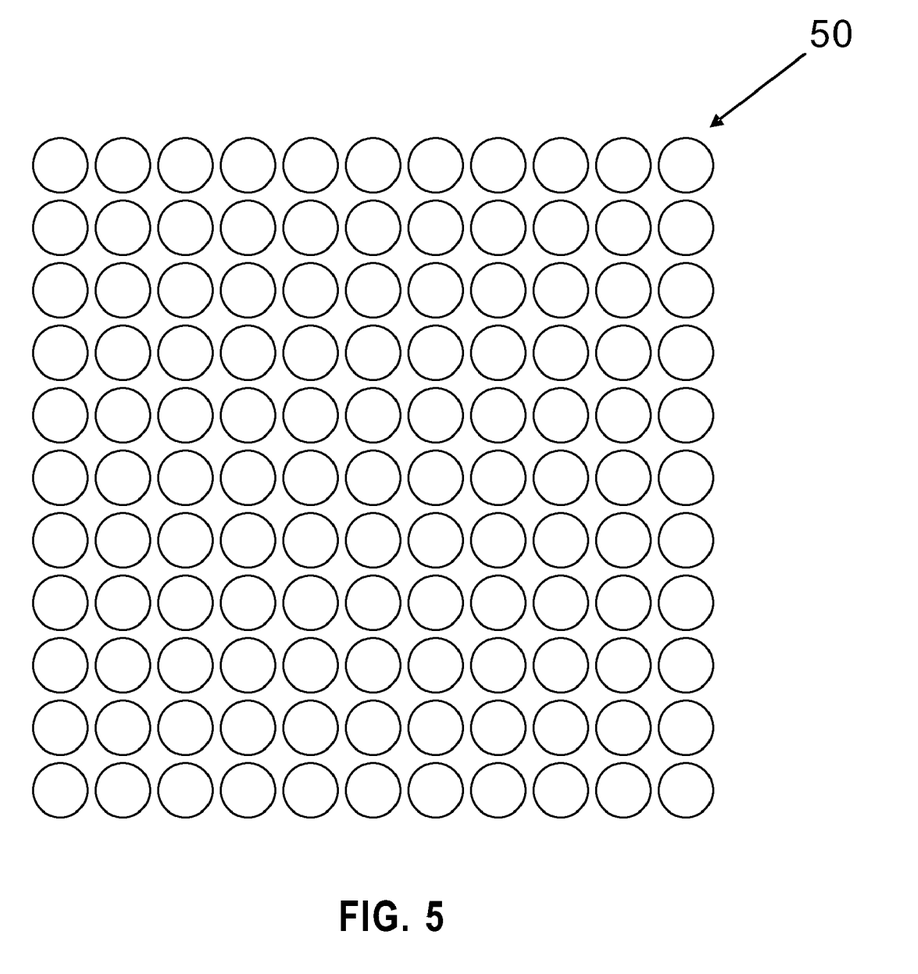
FIG. 5 illustrates an array of solder balls, generally at 50, representing typically an array of either C4 balls or BGA pads, shows the utility of having one or more C4 balls with the array freeze before others in the same array for a variety of manufacturing applications.

FIG. 5 illustrates an array of solder balls, generally at 50, representing typically an array of either C4 balls or BGA pads. This is the basic application of an array of C4 balls securing two substrates together as previously described with reference to FIG. 3.

Figure 6:
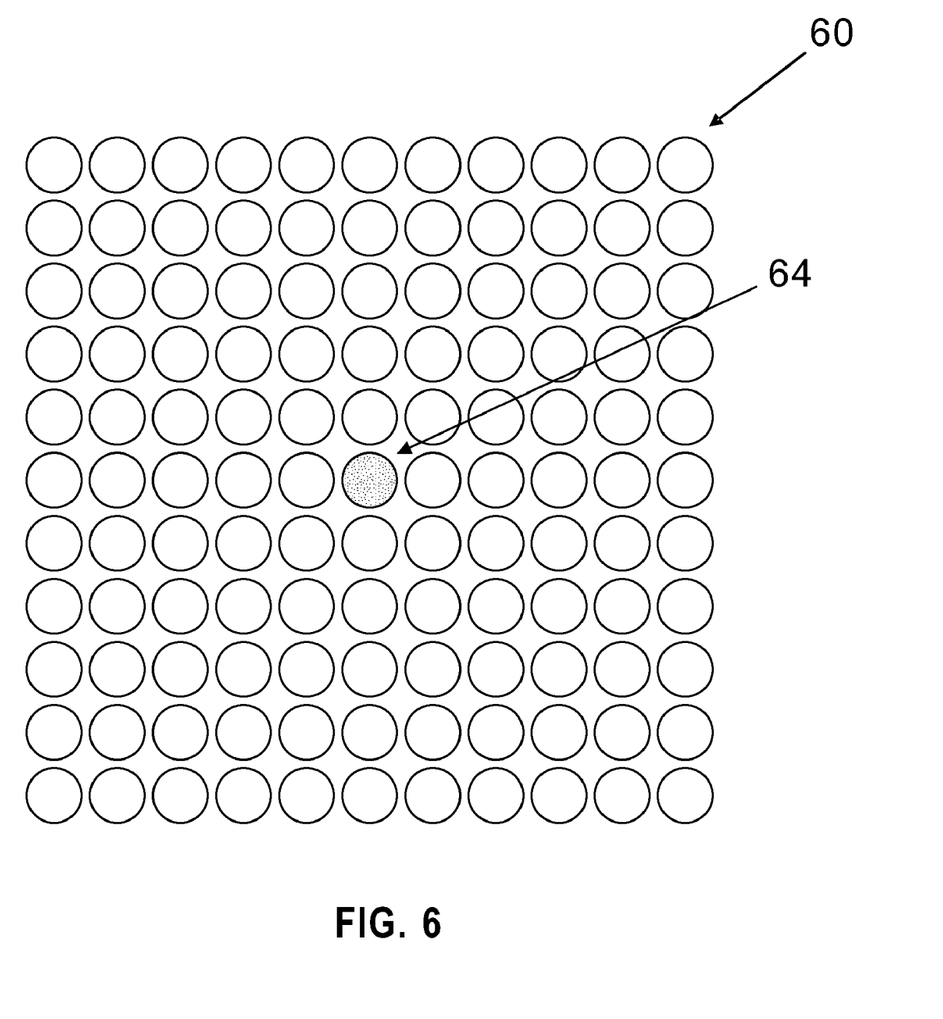
FIG. 6 illustrates the array of solder balls of FIG. 5 wherein a single C4 ball 64 at or near the center of array 60 is comprised of the solder composition with one or more nucleating modifiers, in accordance herewith, to impart therein an undercooling differential to said modified C4 balls, the remaining C4 balls in the array consist of unmodified solder.

FIG. 6 illustrates an array of solder balls, collectively at 60, wherein a single C4 ball 64 at or near the center of an array of C4 balls is comprised of the solder composition with one or more nucleating modifiers having been added thereto. The single C4 ball would have an undercooling temperature differential relative to the remaining balls in the same array. Therefore, this central C4 ball would freeze while the other balls in the array remained in the melt. This would facilitate the pinning of an above substrate to a below substrate at a central location in advance of the other C4 balls freezing.

Figure 7:
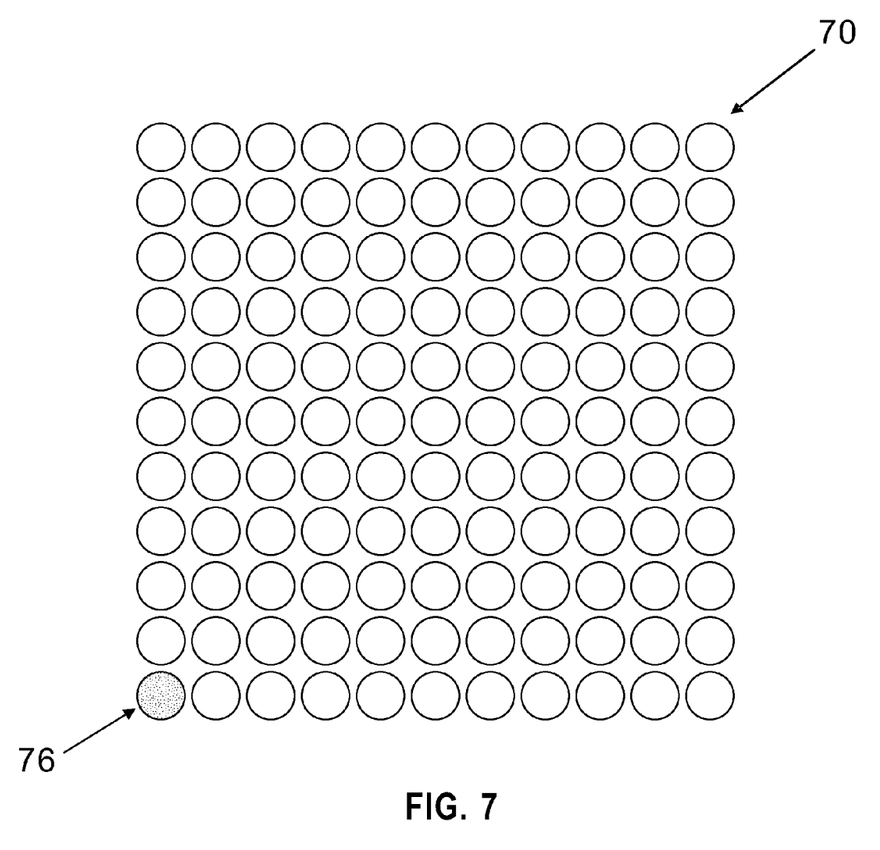
FIG. 7 illustrates the array of solder balls of FIG. 5 wherein a single C4 ball 76 at or near one corner of array 70 is comprised of a solder composition with one or more nucleating modifiers, in accordance herewith, to impart therein an undercooling differential to said modified C4 ball, while the remaining C4 balls in the array consist of unmodified solder.

FIG. 7 illustrates an array of solder balls, collectively at 70, wherein a single C4 ball 76 at or near one corner of an array of C4 balls is comprised of a solder composition with one or more nucleating modifiers having been added thereto. This single C4 ball would have an undercooling temperature differential relative to the remaining balls in the same array. This corner C4 ball would therefore freeze at a higher temperature while the remaining balls in the array would still be in a liquid state. This would effectively fix an above substrate to a below substrate at this corner location in advance of the freezing of the other C4 balls in this same array.

The application of the freezing of specific C4 balls in an array is not limited to single C4 balls. Rather, once the solder composition has been modified with the desired nucleation modifiers, any number of C4 balls within the array could be made to freeze at a desired temperature while the remaining balls in the array are still in the melt. This allows the remaining C4 balls to stay liquid for a much greater temperature span during cooling.

Nucleation modifiers can be added to solder arrays in a non-uniform distribution in instances wherein, within the same package, it is desirable to have some solder balls freeze while others remain in the melt (e.g.: center only, single corner, multiple corners, and the like). This could be accomplished by ball dropping methods, by plating, or by sequential C4 mold filling. One potential benefit is early securing at high temperature during bonding between top and bottom substrates by utilizing a few nucleation modified C4 balls (e.g.: in center of the array), leaving the remainder molten so that they may freeze at lower temperatures (maybe even outside of reflow oven) to minimize package stress.

One skilled in this art would appreciate that this has many advantages in the manufacturing processes. For instance, differential pinning of distant multiple points across the array helps control warpage. A single bump or cluster of two or three nucleation modified C4 balls can be positioned in the center to freeze at a reduced undercooling temperature to pin the module in place, leaving the outer bumps to freeze with the greatest undercooling possible. This deliberately imparts a stress gradient between the pinned distant balls and, in doing so, can impart one or more controlled curvatures if it is desired to manipulate the shape and overall stress of the package during manufacture. This also helps reduce final effect of CTE mismatch without expensive process time to cool an entire array held in place by precise tooling.

Further, having a cluster of C4 balls freeze in the middle of an array allows the chip to be secured to the substrate in a central area where strain due to thermal expansion mismatch is relatively minimal while joining can still occur along the periphery of the chip in a more controlled manner at a later stage to minimize stress. If distance balls are made to freeze before remaining balls this would create regions of high stress in order to effectively manipulate the shape of the package elements themselves. Thus upon cooling, predefined areas will be pinned first and, upon further cooling, a stress axis will develop along that line causing bowing and controlled distortion that can be used to counteract unwanted bowing and distortion along that or other axis. As such, bow distortion could be induced in a controlled fashion to counteract undesirable bow imparted by bonded devices, inherent warp, etc.

Examples are provided, specifically with reference to FIGS. 8-11.

Figure 8:
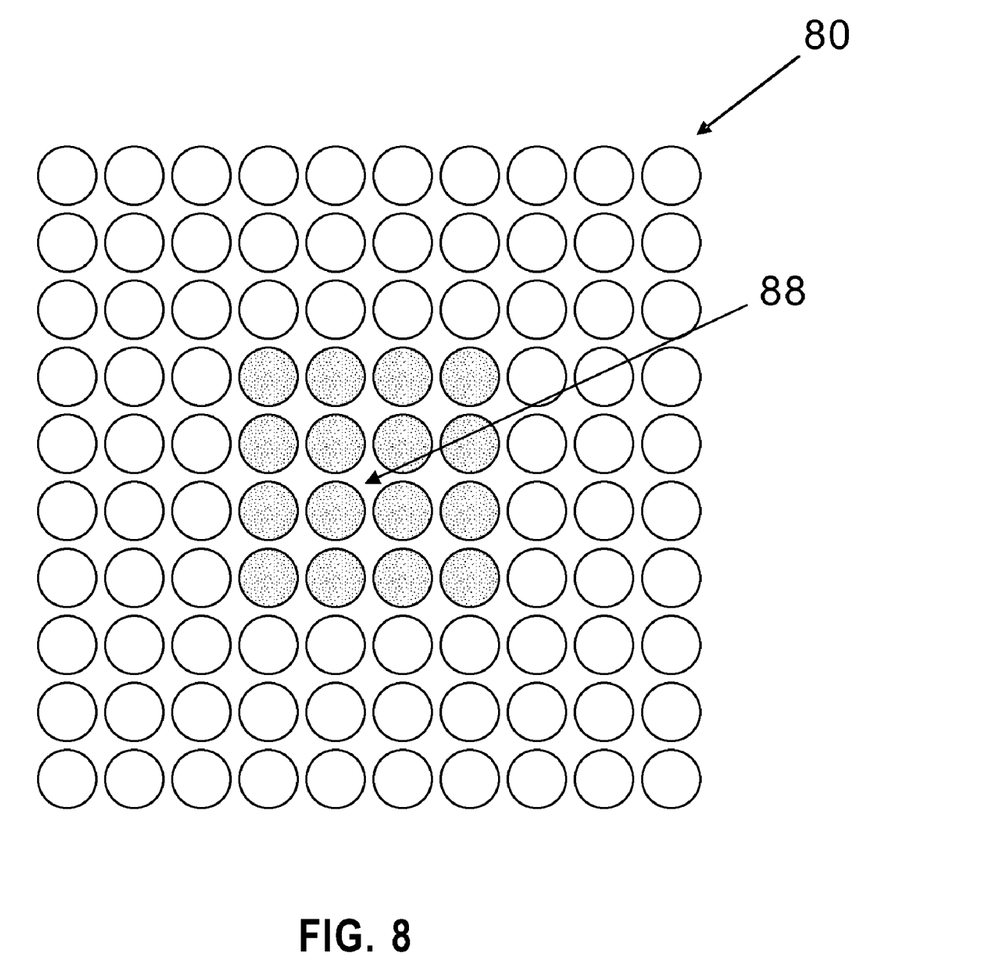
FIG. 8 illustrates the array of solder balls of FIG. 5 wherein a defined group of C4 balls, collectively at 88, at or near the center of array 80 are composed of a solder composition with one or more nucleating modifiers, in accordance herewith, to impart therein an undercooling differential to said modified C4 balls, while the remaining C4 balls in the array consist of unmodified solder.

FIG. 8 illustrates an array of solder balls, collectively at 80, wherein a predefined group of C4 balls are positioned at or near the center of array, shown collectively at 88. The C4 balls in the predefined group 88 are composed of a solder composition with one or more nucleating modifiers added thereto. In this configuration, the predefined group of C4 balls will freeze while the remaining C4 balls in the array are still in the melt. This will effectively secure an above substrate to a below substrate, as discussed with reference to FIG. 3, while the other C4 balls in the array remain in the liquid state. Also, because the grains imparted into the C4 ball are smaller, with random orientations and more uniformity, the C4 balls 88 will also have similar mechanical properties and be more reliable. Other configurations follow.

Figure 9:
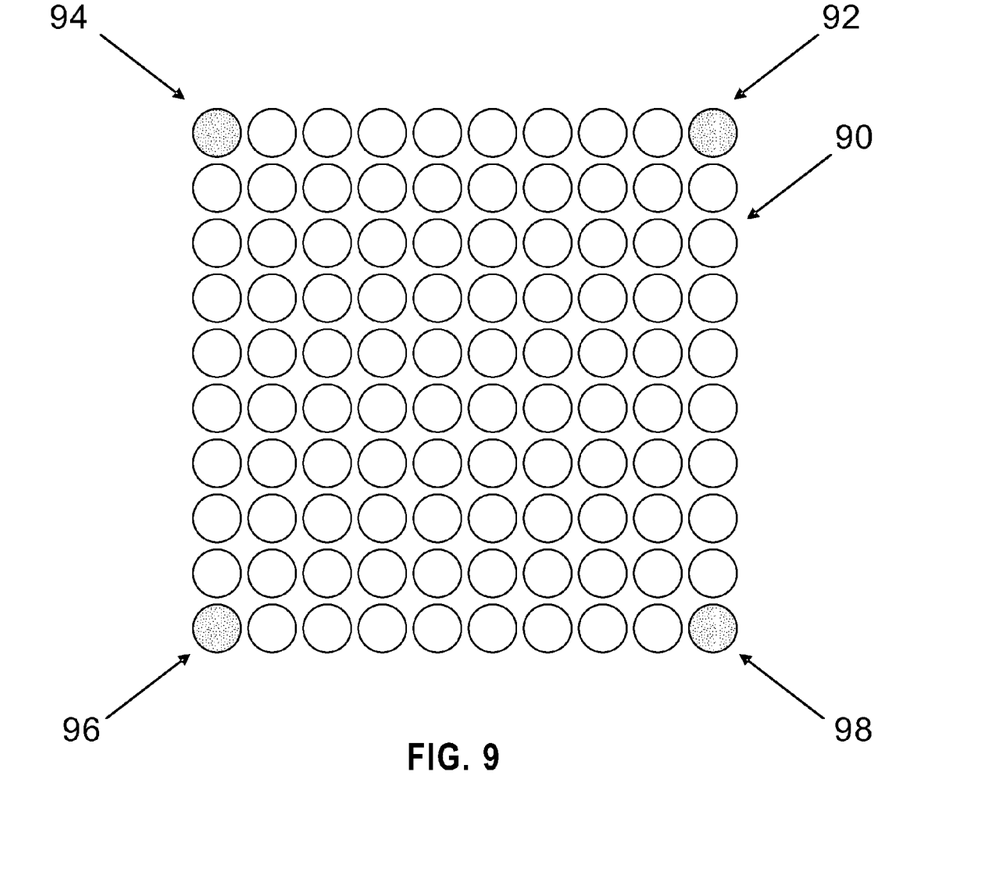
FIG. 9 illustrates the array of solder balls of FIG. 5 wherein a defined group of C4 balls 92, 94, 96, 98 at the corners of array 90 are composed of a solder composition with one or more nucleating modifiers, in accordance herewith, to impart therein an undercooling differential to said modified C4 balls, while the remaining balls in the array consist of unmodified solder.

FIG. 9 illustrates an array of solder balls, collectively at 90, wherein a predefined group of C4 balls are positioned at the corners of array, at 92, 94, 96, 98. In this configuration, the C4 balls at the corners are composed of a solder composition with one or more nucleating modifiers having been added thereto. These corner C4 balls will freeze while the remaining balls remain in the melt thereby securing the above substrate to the below substrate at the corners.

Figure 10:
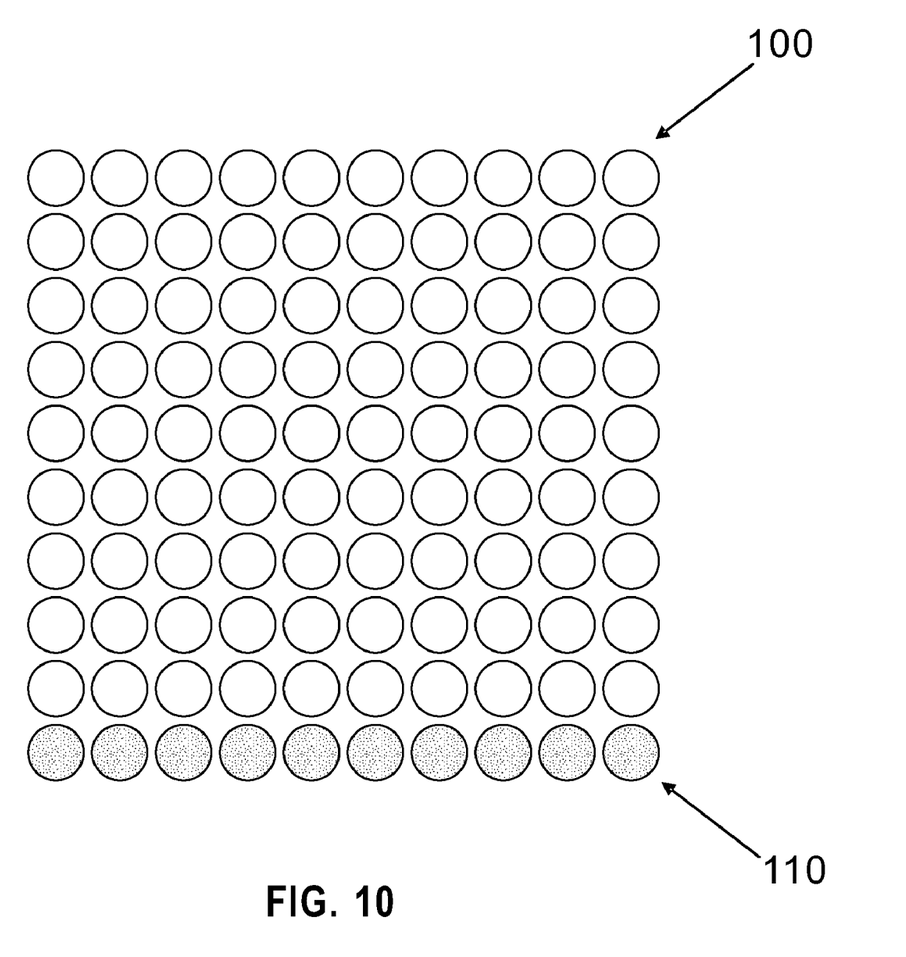
FIG. 10 illustrates the array of solder balls of FIG. 5 wherein a defined group of C4 balls, collectively at 110, along one edge of array 100 are composed of a solder composition with one or more nucleating modifiers, in accordance herewith, to impart therein an undercooling differential to said modified C4 balls, while the remaining balls in the array consist of unmodified solder.

FIG. 10 illustrates the array of solder balls, collectively at 100, wherein a predefined group of C4 balls are positioned along one edge of the array, collectively at 100. The C4 balls in this predefined group 80 are composed of a solder composition with one or more nucleating modifiers having been added thereto. With these C4 balls having been imparted with a reduced undercooling temperature relative to the undercooling temperature of the remaining balls in the array, this row of C4 balls will freeze while the remaining balls in the array remain in the melt. In such a configuration, the above substrate will be secured to a below substrate along a single edge in advance of the remaining solder balls in this same array freezing. This is particularly advantageous in manufacturing instances where may be important to allow for bending or flexing of the package before the other C4 balls in the array are brought to freezing temperature.

Figure 11:
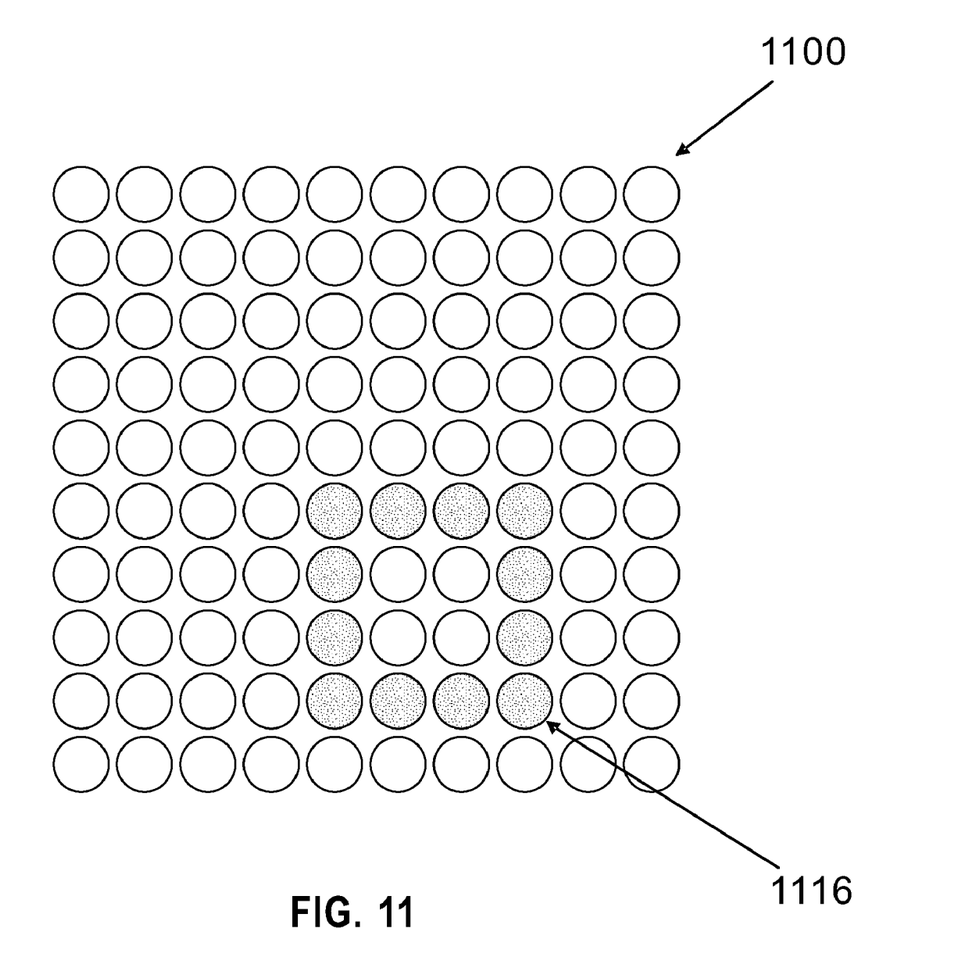
FIG. 11 illustrates the array of solder balls of FIG. 5 wherein a defined group of C4 balls, collectively at 1116, forming a square pattern within array 1100 are composed of a solder composition with one or more nucleating modifiers, in accordance herewith, to impart therein an undercooling differential to said modified C4 balls, while the remaining balls in the array consist of unmodified solder.

FIG. 11 illustrates the array of solder balls, collectively at 1100, wherein a defined group of C4 balls, collectively at 1116, form a square pattern within array 1100. The C4 balls in this configuration 1116 are composed of a solder composition with one or more nucleating modifiers having been added thereto. The addition of the nucleating modifiers to the solder composition of the C4 balls 1116 imparts therein a reduced undercooling temperature relative to the remaining C4 balls in the array. In this configuration, an above substrate can be secured to a below substrate while the remaining balls in the array are still in the melt. This is advantageous in those instances wherein it is important to firmly secure one particular area of the package before the other C4 balls in the array freeze.

It should be clearly understood that any variation or pattern of specific C4 balls having the solder composition with the nucleation modifiers added thereto can be used in the array. For example, an X-pattern in the array would secure an above substrate to a below substrate in 2 directions. Or, specific C4 balls having the solder composition with the nucleation modifiers added thereto could be positioned along a rim completely or partially around the circumference of the array. Other patterns and usages are envisioned and would, at least in part, be dependent on the specifics or outcomes intended to be imparted or otherwise achieved in or by the manufacturing process.

Alternatively, solder compositions with the nucleation modifiers added thereto having the same reduced melting point can be utilized on differing hierarchical levels of the package with different layers distinguished by their freezing points. This produces a freezing point hierarchy which has utility analogous to the common melting point hierarchy.

In another embodiment of this invention, the nucleation modifiers are added to the solder through a process of terminal metallurgy. In this process, the nucleating modifiers are added to one or both pad surfaces intended to be joined by the solder. The nucleation modifiers are imparted to the solder by physical contact while the solder is in the liquid state. For example, a 50 angstrom layer of Ir could be added to the BGA pads in a second level package. Or, a 50 angstrom layer could be added to the C4 pads. This can be done either by coating the entire pad with the nucleation modifier or by placing a small spot of nucleating substance somewhere on the pad for instance the center. Alternatively, all pads would have the same nucleation coverage.

In another embodiment, some pads within an array are coated with the nucleation modifiers while others do not. Alternatively, some pads are coated with differing concentration or reduced concentrations. Alternatively, some pads are coated with modified nucleation modifiers or completely different nucleation modifiers.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments. Furthermore, it is intended that the appended claims cover any and all such applications, modifications, and embodiments within the scope of the present invention.

What is claimed is:

1. A process of manufacture of microelectronic packaging, comprising:
    creating a solder composition comprising at least one nucleating modifier to induce nucleation sites therein which facilitate a reduction in the undercooling temperature of solder joints comprised of said solder composition;
    joining together a first substrate and a second substrate with an array of solder joints having substantially similar melting points, at least one solder joint in the array comprising said solder composition having a reduced undercooling temperature relative to one or more joints in the array;
    undercooling the array to freeze the at least one solder joint with the reduced undercooling temperature thereby pinning the first substrate and the second substrate together with the at least one frozen joint while other joints in the array are still melted;
    further undercooling the array to freeze other joints in the array; and
    repeating the process of further undercooling the array until the remaining joints in the array have frozen.

2. The process of manufacture as in claim 1, wherein the first substrate comprises at least a portion of a microelectronic component and the second substrate comprises at least a portion of a circuit board.

3. The process of manufacture as in claim 1, further comprising a plurality of solder joints in a geometric pattern.

4. The process of manufacture as in claim 1, wherein the array comprises at least two solder joints of different undercooling temperatures relative to the remaining joints in the array.

5. The process of manufacture as in claim 1, further comprising imparting a reduced undercooling temperature to the solder composition through a layer of terminal metallurgy.

6. The process of manufacture as in claim 1, wherein the reduced undercooling temperature of at least one joint in the array has changed after having been added to the array.

7. The process of manufacture as in claim 1, further comprising utilizing at least two joints in the array to controllably induce stress.

8. The process of manufacture as in claim 1, wherein the nucleating modifier comprises at least one element of Be, Fe, Cu, Ni, Mo, Zr, Hf, W, Pt, Ir, Rhodium, Ruthenium, Rhenium, Osmium, or tin.

9. The process of manufacture as in claim 1, wherein the nucleating modifier comprises at least one alloy of Be, Fe, Cu, Ni, Mo, Zr, Hf, W, Pt, Ir, Rhodium, Ruthenium, Rhenium, Osmium, or tin.

10. The process of manufacture as in claim 1, further comprising utilizing a plurality of solder compositions with each providing a different undercooling temperature.

11. The process of manufacture as in claim 1, further comprising creating a hierarchy in different layers of a packaging structure of solders with a same melting point but different freezing points.

* * * * *